United States Patent
Grivna et al.

(10) Patent No.: US 8,304,326 B2
(45) Date of Patent: *Nov. 6, 2012

(54) EDGE SEAL FOR A SEMICONDUCTOR DEVICE AND METHOD THEREFOR

(75) Inventors: Gordon M. Grivna, Mesa, AZ (US); Shanghui L. Tu, Phoenix, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 293 days.

This patent is subject to a terminal disclaimer.

(21) Appl. No.: 12/499,241

(22) Filed: Jul. 8, 2009

(65) Prior Publication Data

US 2009/0269912 A1 Oct. 29, 2009

Related U.S. Application Data

(63) Continuation of application No. 11/754,087, filed on May 25, 2007, now Pat. No. 7,615,469.

(51) Int. Cl.
*H01L 21/00* (2006.01)

(52) U.S. Cl. .............. 438/460; 438/462; 257/E21.418
(58) Field of Classification Search .................. 438/460, 438/462, 68, 113, 458; 257/E21.418
See application file for complete search history.

(56) References Cited

U.S. PATENT DOCUMENTS

| 6,078,068 | A | 6/2000 | Tamura | |
|---|---|---|---|---|
| 7,615,469 | B2 * | 11/2009 | Grivna et al. | 438/462 |
| 2004/0026751 | A1 | 2/2004 | Makino | |

* cited by examiner

*Primary Examiner* — Jack Chen
(74) *Attorney, Agent, or Firm* — Robert F. Hightower

(57) ABSTRACT

In one embodiment, an edge seal region of a semiconductor die is formed by forming a first dielectric layer on a surface of a semiconductor substrate near an edge of the semiconductor die and extending across into a scribe grid region of the semiconductor substrate. Another dielectric layer is formed overlying the first dielectric layer. An opening is formed through the first and second dielectric layers. The second dielectric layer is used as a mask for forming a doped region on the semiconductor substrate through the opening. A metal is formed that electrically contacts the doped region and an exterior edge of the first dielectric layer within the opening.

6 Claims, 7 Drawing Sheets

US 8,304,326 B2

EDGE SEAL FOR A SEMICONDUCTOR DEVICE AND METHOD THEREFOR

The present application is a continuation application of prior U.S. application Ser. No. 11/754,087, filed on May 25, 2007, now U.S. Pat. No. 7,615,469 which is hereby incorporated by reference, and priority thereto for common subject matter is hereby claimed.

BACKGROUND OF THE INVENTION

The present invention relates, in general, to electronics, and more particularly, to methods of forming semiconductor devices and structure.

In the past, the semiconductor industry utilized various methods and device structures to form semiconductor devices including discrete devices and integrated circuits. Most semiconductor devices had an edge seal around the outside of the semiconductor die on which the device was formed. The edge seal had various functions including maintaining a uniform potential around the die, collecting charged contaminates, providing an electrical barrier to electrical contaminants along the edge of the active region of the die, providing a moisture barrier, and reducing cracking near the edge of the die. The edge seal normally included a metalization layer that was formed near an edge of the semiconductor device. Typically, several processing steps were required to form such edge seals. The various processing steps required to form the edge seal generally increased the cost of the semiconductor device. One example of such an edge seal was disclosed in U.S. Pat. No. 6,078,068 that issued to Ronald Tamura on Jun. 20, 2000.

Accordingly, it is desirable to have an edge seal structure and a method of forming an edge seal that uses fewer processing steps and that has a lower cost.

For simplicity and clarity of the illustration, elements in the figures are not necessarily to scale, and the same reference numbers in different figures denote the same elements. Additionally, descriptions and details of well-known steps and elements are omitted for simplicity of the description. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

DETAILED DESCRIPTION OF THE DRAWINGS

Figure 1:
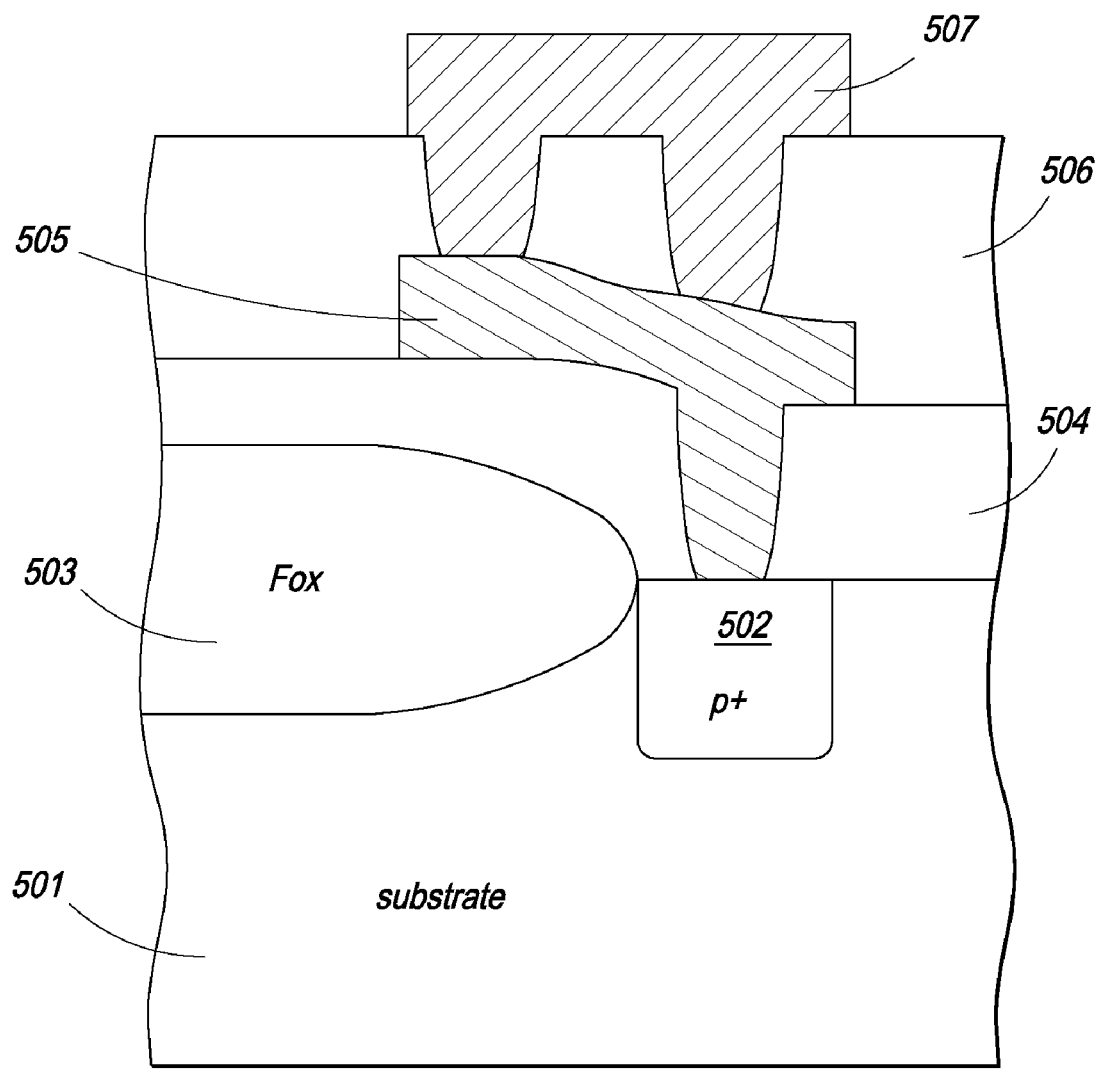
FIG. 1 illustrates an enlarged cross-sectional view of a edge seal according to the prior art.

FIG. 1 illustrates a prior art edge seal region of a prior art semiconductor die. A portion of a semiconductor die 500 is masked and the exposed portion is oxidized to form a field oxide region 503. The process of forming field oxide region 503 is usually referred to as local oxidation of silicon or LOCOS. Field oxide region 503 is used as a mask for implanting a doped region 502 in substrate 501 that is self-aligned to one edge of region 503. Region 502 generally is formed along with doped regions within an active area of die 500. The active area is to the left of field oxide region 503. The dopant species of doped region 502 generally is also activated along with the other doped regions of die 500. Subsequently, an oxide layer 504 is formed on field oxide region 503 and the adjacent exposed surface of substrate 501. Layer 504 usually extends to an edge 510 of die 500. A mask is applied and patterned, and layer 504 is etched to form an opening overlying doped region 502. Thereafter, a metal is deposited into the opening to electrically contact doped region 502. A metal mask is subsequently applied and patterned, and portions of the metal are removed, such as by an etching step. Subsequently, inter-layer dielectric layers, such as layer 506, and other metal layers, such as layers 505 and 507, may be formed as desired. As can be seen, several process steps are required for masking and implanting region 502, masking and forming layer 504, masking and forming the opening in layer 504, and masking and forming metal layer 505. All of these process steps add to the cost of die 500.

Figure 2:
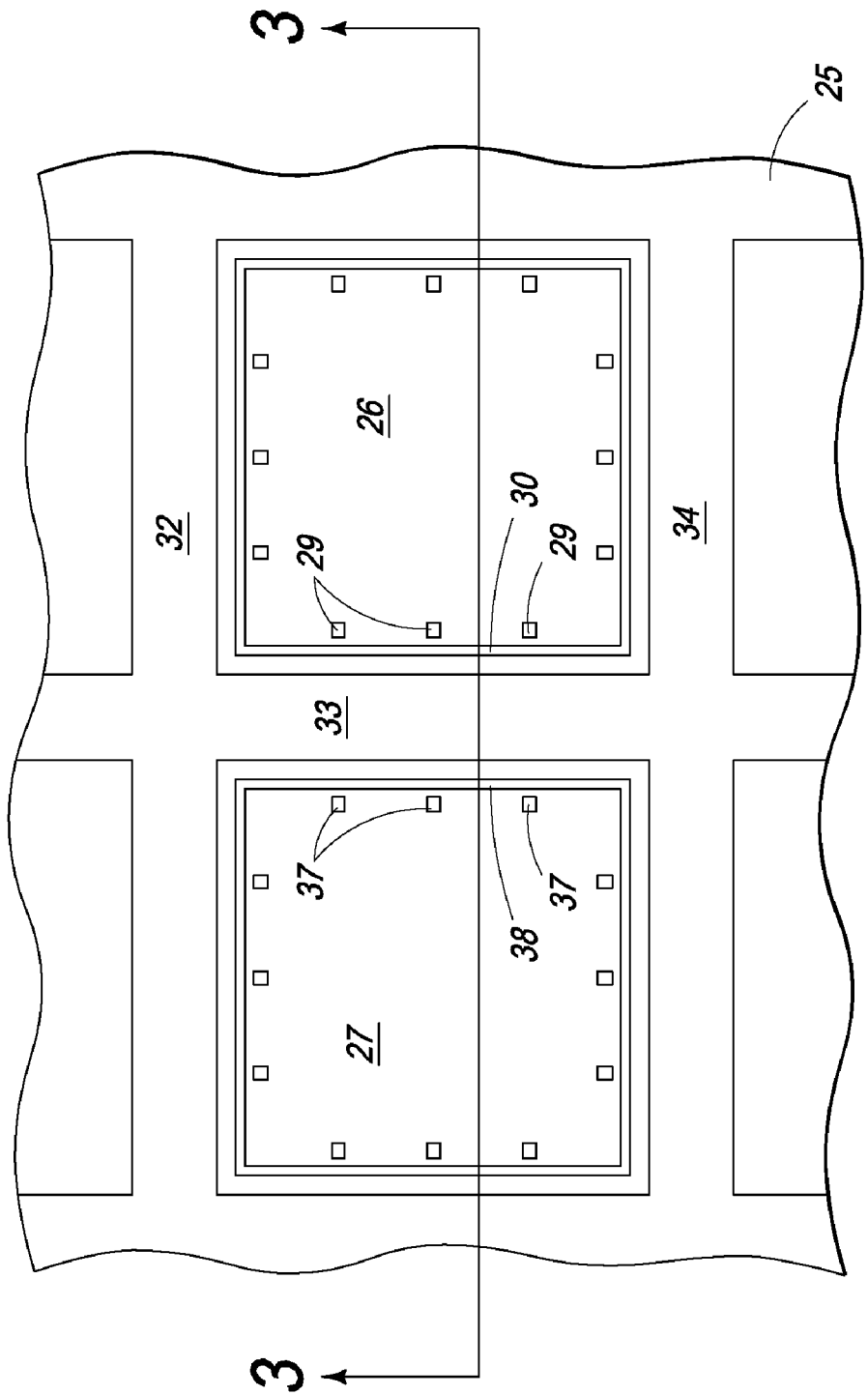
FIG. 2 illustrates an enlarged plan view of an embodiment of a portion of a semiconductor wafer on which a plurality of semiconductor die are formed in accordance with the present invention.

FIG. 2 illustrates an enlarged plan view of a portion of a semiconductor wafer 25 on which an embodiment of a plurality of semiconductor die, such as a die 26 and a die 27, are formed. Die 26 includes an interior section where passive devices and active devices, such as transistors and diodes, are formed. A plurality of bonding pads 29 are outside of the interior section toward an outside edge of die 26. An exemplary embodiment of an edge seal region or edge seal 30 is positioned between the plurality of bonding pads 29 and the exterior edge or outside edge of die 26. Similarly, die 27 includes an interior section where passive devices and active devices are formed. A plurality of bonding pads 37 are outside of the interior section toward an exterior edge or outside edge of die 27. An exemplary embodiment of an edge seal region or edge seal 38 is positioned between plurality of bonding pads 37 and the outside edge of die 27. Dice 26 and 27 generally have scribe grids along each side of the semiconductor die as illustrated by scribe grids 32, 33, and 34.

Figure 3:
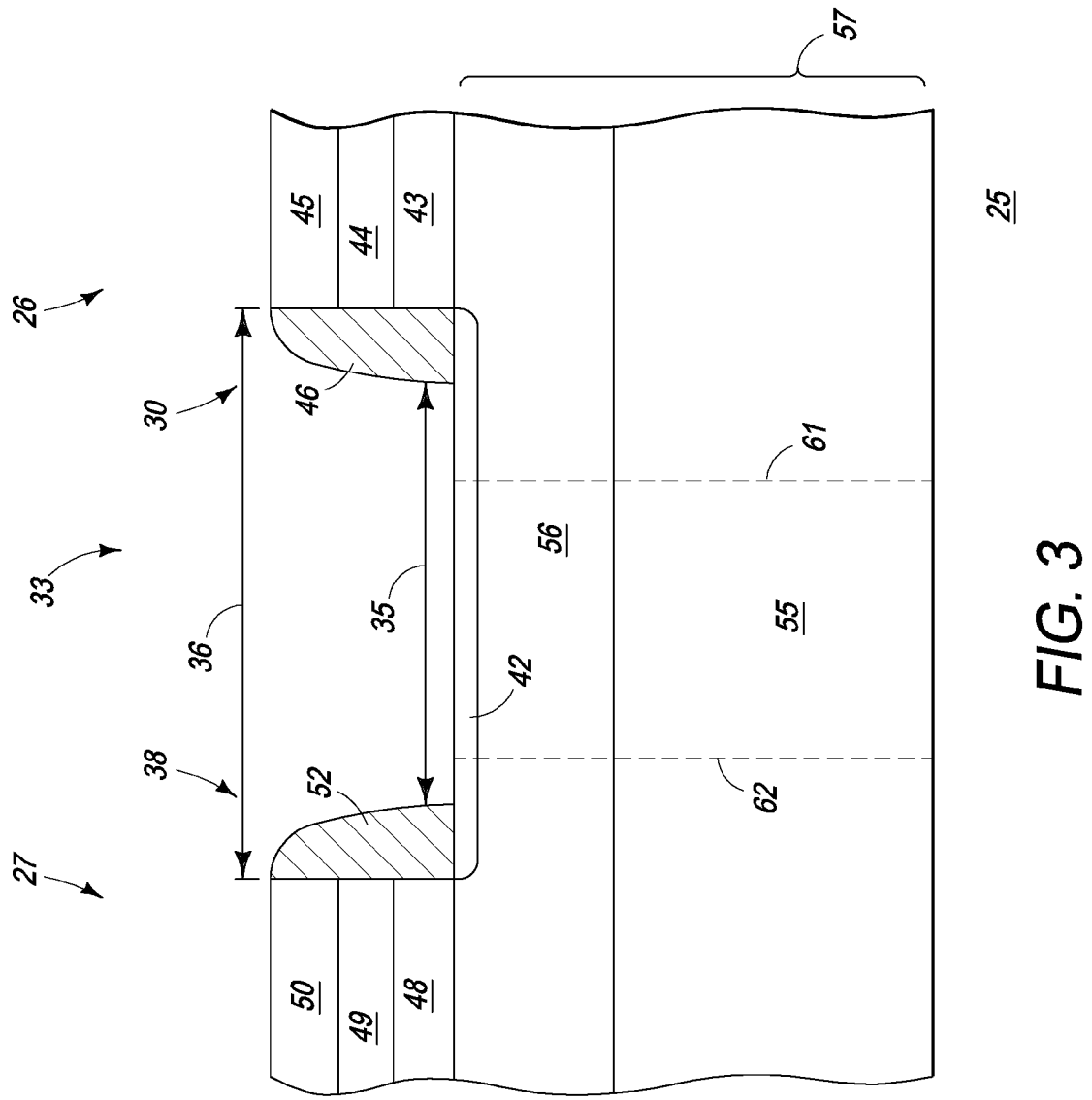
FIG. 3 illustrates an enlarged cross-sectional view of a portion of an embodiment of the plurality of semiconductor die of FIG. 1 in accordance with the present invention.

FIG. 3 illustrates an enlarged cross-sectional view of a portion of dice 26 and 27 that includes scribe grid 33 and the exemplary embodiments of edge seals 30 and 38. This description has references to FIG. 2 and FIG. 3. As will be seen further hereinafter, edge seal 30 is formed to include a metal layer 46 that is positioned to electrically contact a doped region within a substrate of the die and that also contacts an exterior edge or outside edge of a thick dielectric layer, for example a field oxide layer, that is on a surface of a semiconductor substrate of the die.

In the preferred embodiment, die 26 and 27 are vertical power MOS transistors and are illustrated to have a single metal interconnect layer. However, those skilled in the art will appreciate that edge seals 30 and 38 may be formed on integrated circuit die that have various numbers of active transistors along with a plurality of metal interconnect layers and associated inter-layer dielectrics. Dice 26 and 27 are formed on a semiconductor substrate 57 that includes a bulk semiconductor substrate 55 and an epitaxial layer 56 that is formed on bulk semiconductor substrate 55. In some embodiments, epitaxial layer 56 may be omitted or may be replaced by a doped region of substrate 57.

For the exemplary embodiment illustrated in FIG. 3, die 26 includes a thick dielectric layer 43, such as a field oxide layer, an inter-layer dielectric 44 that is formed on layer 43, another dielectric layer 45 (such as a passivation layer) on dielectric 44, and a metal layer 46 that is positioned on substrate 57 and abutting layer 43. Similarly, die 27 includes a thick dielectric layer 48, such as a field oxide layer, an inter-layer dielectric 49 that is formed on layer 48, another dielectric layer 50 (such as a passivation layer) that is formed on dielectric 49, and a metal layer 52 that is positioned on substrate 57 and abutting layer 48. Scribe grid 33 includes a portion of wafer 25 that is positioned between metal layers 46 and 52, and has a width or distance 35 as illustrated by an arrow. Those skilled in the art will appreciate that the width of scribe grid 33 extends between metal layers 46 and 52, but that only a portion of the width is removed when die 26 and 27 are singulated from wafer 25. Those skilled in the art will also realize that metal layers 46 and 52 may or may not be covered with further dielectric or metal layers. The region of wafer 25 where exterior edges or outside edges 61 and 62 of respective dice 26 and 27 will subsequently be formed are illustrated in general by dashed lines.

Figure 4:
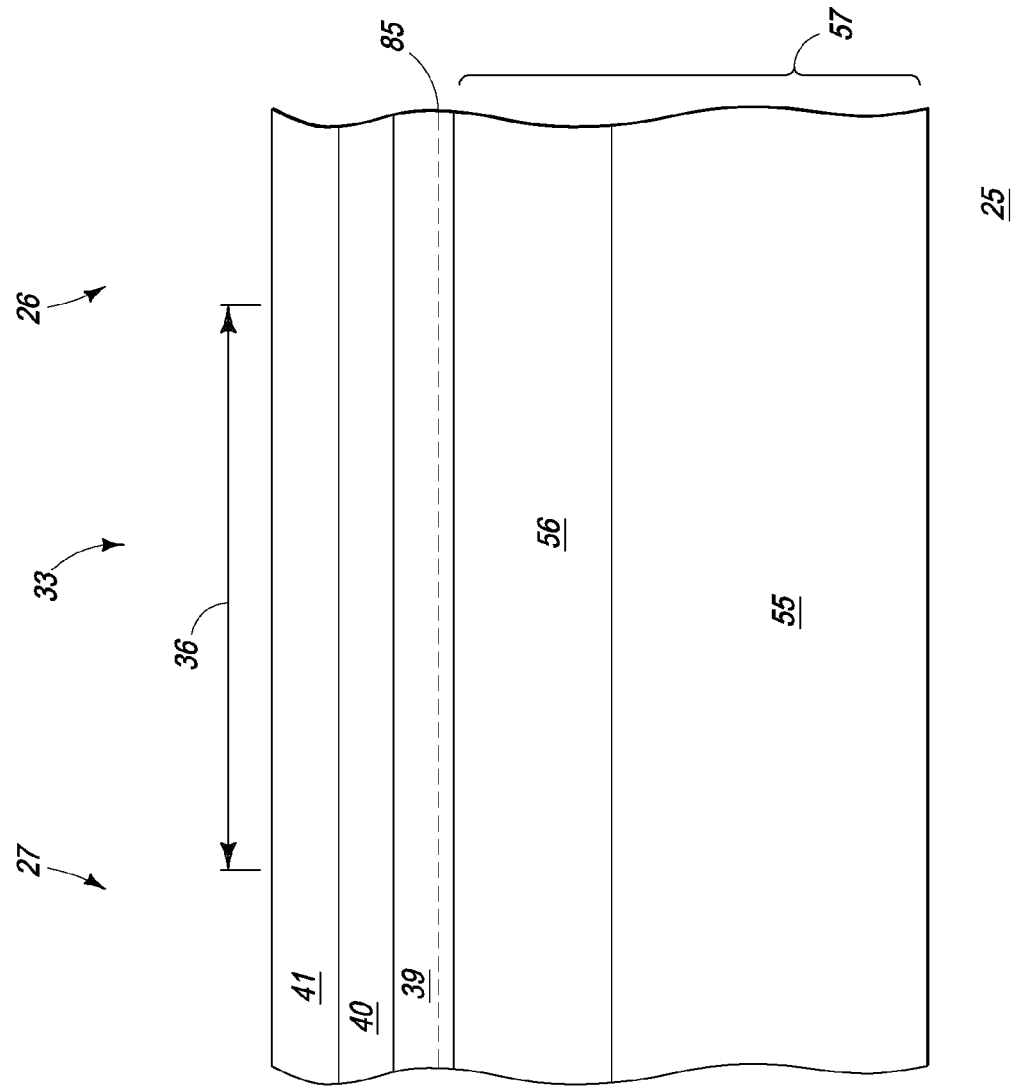
FIG. 4-FIG. 6 illustrate enlarged cross-sectional views at various stages of forming the plurality of semiconductor die of FIG. 1 in accordance with the present invention.

FIG. 4 illustrates an enlarged cross-sectional view of wafer 25 at an early stage in the formation of die 26 and 27. Prior to forming active devices within the interior section of die 26 and 27, a thick dielectric layer 39 is generally formed on the surface of wafer 25. In most embodiments, dielectric layer 39 is formed as a field oxide region by thermal oxidation of a portion of substrate 57. During this formation step, layer 39 preferably is formed to extend across the entire width of scribe grid 33 and generally extends to the active regions of dice 26 and 27. Those skilled in the art will appreciate that layer 39 usually is masked from some of the active regions within the interior section of dice 26 and 27. In alternate embodiments, dielectric layer 39 may be other types of thick dielectrics that are formed on the surface substrate 57 and that are used to minimize breakdown between different regions of die 26 or die 27. For such an alternate embodiment, dielectric layer 39 may be applied as a blanket layer that covers the surface of wafer 25 and is then patterned within the interior section of dice 26 and 27. However, the portion of layer 39 within scribe grid 33 that extends to the interior section of dice 26 and 27 would not be patterned during those steps. For example, dielectric layer 39 may be a layer of silicon dioxide or silicon nitride that is deposited on the surface of wafer 57. In some such alternate embodiments, a thin layer of silicon dioxide may be formed on the surface of wafer 57 prior to forming dielectric layer 39 as illustrated by a dashed line 85. Typically, this is a surface layer of silicon dioxide that usually is at least an order of magnitude thinner than the thickness of layer 39. Layer 39 generally has a thickness that is greater than approximately 0.2 microns.

After forming layer 39, the doped regions of the active and other portions of die 26 and 27 typically are formed within the interior sections of dice 26 and 27. During those doping steps, layer 39 acts as a blocking layer to prevent doping the portion of wafer 25 that includes scribe grid 33 and the region where layers 46 and 52 are to be formed. Thereafter, a dielectric layer 40 is formed on layer 39 and on the interior sections of die 26 and 27 to function as an inter-layer dielectric that facilitates forming single layer or multi-layer metalization on the interior sections of die 26 and 27. As is well known to those skilled in the art, layer 40 generally is applied as a blanket layer that covers all of layer 39 and then patterned to form openings as required to make appropriate electrical connections within the interior section of dice 26 and 27. After all the metal interconnections are formed and bonding pads are formed for dice 26 and 27, another dielectric layer 41 may be formed on dielectric layer 40 to function as a passivation layer that covers all of wafer 25. Those skilled in the art will appreciate that other dielectric layers and metal layers may be formed between layer 40 and layer 41 if more metal interconnect layers are used within the interior section of dice 26 and 27.

Figure 5:
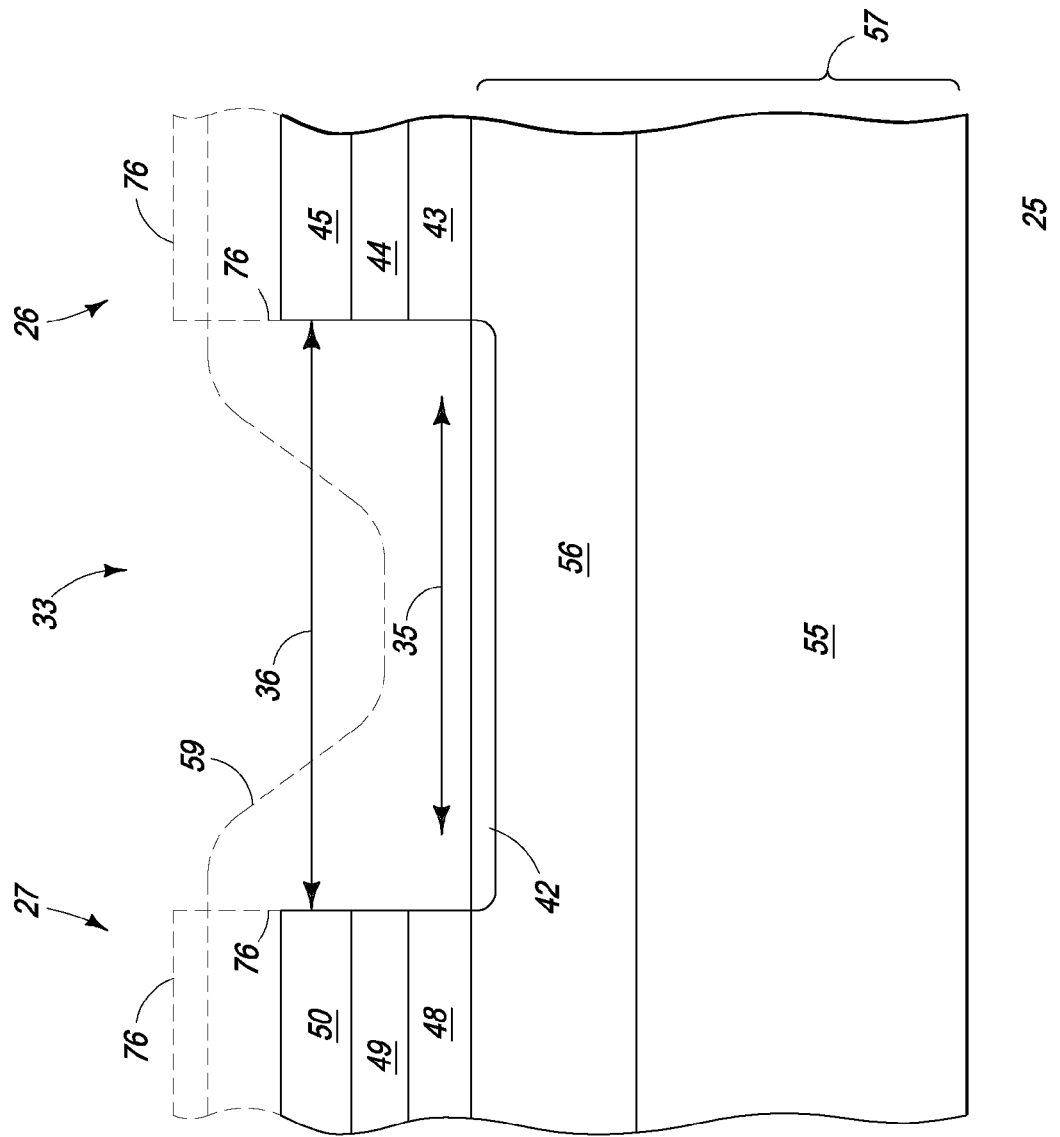

FIG. 5 illustrates a subsequent stage in the process of forming dice 26 and 27. A mask, illustrated by dashed lines 76, is applied and patterned to expose portions of layer 41 (FIG. 4) that overlie the bond pad areas of the die and that also overlie the region where grid 33 and metal layers 46 and 52 are to be formed. The opening in the mask overlying scribe grid 33 and metal layers 46 and 52 has a width 36. The mask usually covers substantially the remainder of dice 26 and 27 except where other scribe grids, such as scribe grids 32 and 34, and associated edge seal metal layers, are to be formed. The opening in the mask is used to simultaneously form an opening through layer 41 to the bond pads and through layers 41, 40, and 39 to expose the surface of substrate 57 within the opening. After forming the opening, the portions of layer 41 that remain overlying dice 26 and 27 are illustrated as dielectric layers 45 and 50, respectively. The portions of dielectric layer 40 that remain overlying die 26 and 27 are illustrated as dielectric 44 and layer 49, respectively. Similarly, the portions of layer 39 that remain overlying dice 26 and die 27 are illustrated as respective dielectric layers 43 and 48. Exterior edges of layers 43-45 and 48-49 are exposed along the sidewalls of the opening. Mask 75 is removed and the exposed portion of the surface of substrate 57 is doped to form a doped region 42 on the surface of substrate 57 and within the opening. Typically, the dopants are implanted through the opening and layers 45 and 50 function as a mask that prevents doping other portions of dice 26 and 27. Since the dopants within the interior section of dice 26 and 27 are already activated and metal is already applied in these interior sections, the dopants within region 42 usually do not receive an activation step. The high temperatures of an activation step could damage the active areas and metal layers within the interior section of dice 26 and 27. Thereafter, a metal layer 59 is formed as a blanket layer that covers dielectric layers 45 and 50 in addition to the exposed surface of substrate 57.

Referring back to FIG. 3, metal layer 59 is anisotropically etched to remove the portions of metal layer 59 that are on dielectric layers 45 and 50 and on most of the surface of doped region 42 but leave portions of layer 59 as metal layers 46 and 52 that electrically contact doped region 42. Because of the blanket deposition and anisotropic etching, metal layer 46 mechanically abuts the exterior edges or outside edges of layer 43, dielectric 44, and layer 45 in addition to abutting and electrically contacting doped region 42. Similarly, metal layer 52 mechanically abuts the exterior edges of layers 40, 49, and 50 in addition to abutting and electrically contacting doped region 42. It should be noted that in another embodiment it may also be possible to use a patterned photo resist layer to mask all of or portions of the anisotropic etching of metal layer 59. Subsequently, wafer 25 usually is heated to a temperature required to sinter metal layers 46 and 52. Wafer 25 is heated to a temperature of approximately three hundred to six hundred degrees Celsius (300-600° C.) and preferably to about four hundred twenty five degrees Celsius (425° C.). Additionally, because an anisotropic etch is used, no masking step is required to form metal layer 59 into metal layers 46 and 52. Even though the dopants of region 42 do not receive an activation step, the dopants usually are heated during the steps of forming metal layer 59 and the patterning required to form metal layers 46 and 52. An ohmic contact is formed between region 42 and metal layers 46 and 58. In the preferred embodiment, bulk substrate 51 and layer 56 are N-type material, region 42 is N-Type material having a peak doping concentration no less than about $1\times10^{20}$ atoms/cm$^3$, and the material used for metal layers 46 and 52 is aluminum. The resulting structure forms an ohmic contact between region 42 and layers 46 and 52. In the preferred embodiment of a vertical power MOS transistor, substrate 57 usually forms a drain region of the transistor, thus, layers 46 and 52 generally are not electrically connected to any other potential other than the electrical potential received through substrate 57 and region 42. In other embodiments, such as an integrated circuit, layers 46 and 52 may be electrically connected to a bonding pad that is expected to be connected to a common ground potential of the integrated circuit.

Figure 6:
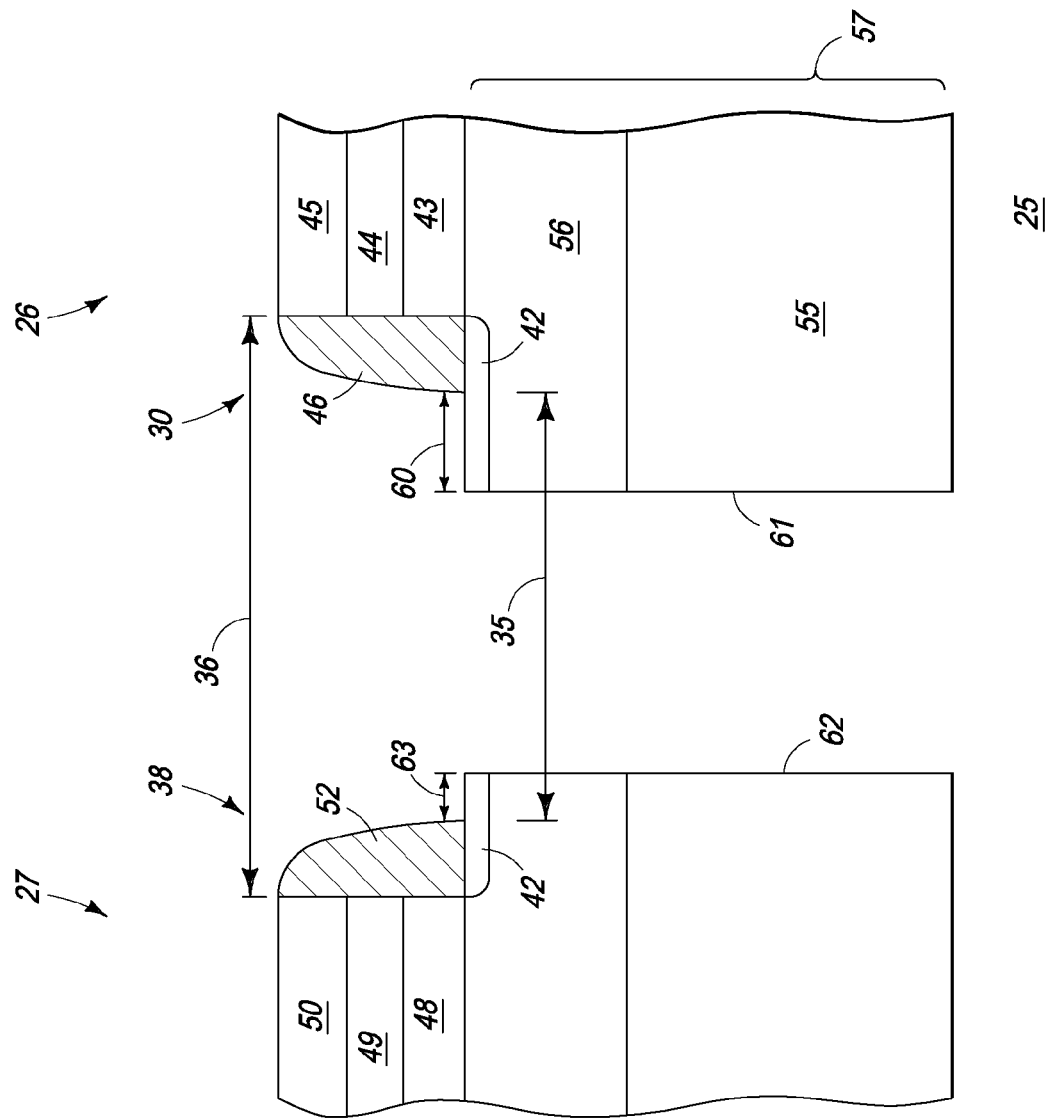

Referring now to FIG. 6, wafer 25 is singulated to separate the dice on wafer 25 such as by scribing through scribe grids 32, 33, and 34 thereby singulating die 26 and 27. The process of singulating die 26 and 27 removes a vertical portion of wafer 25 between dice 26 and 27 and exposes outside edges 61 and 62 of respective dice 26 and 27. After singulation, metal layer 46 is a distance 60 from outside edge 61 of die 26. Distance 60 is illustrated in general by an arrow. Similarly, metal layer 52 is a distance 63 from edge 62. Typically, distance 35 is between about seventy-five and one hundred (75-100) microns and distances 60 and 63 are about twenty to thirty (20-30) microns. Forming thick dielectric layer 39 (including layers 43 and 48), dielectric layer 40 (including dielectrics 44 and 49), and dielectric layer 41 (including layers 45 and 50) to extend into edge seals 30 and 38 and into the scribe grid, and subsequently forming an opening through them to form doped region 42 and metal layers 46 and 52 minimizes the number of processing operations required to form edge seals 30 and 38.

Figure 7:
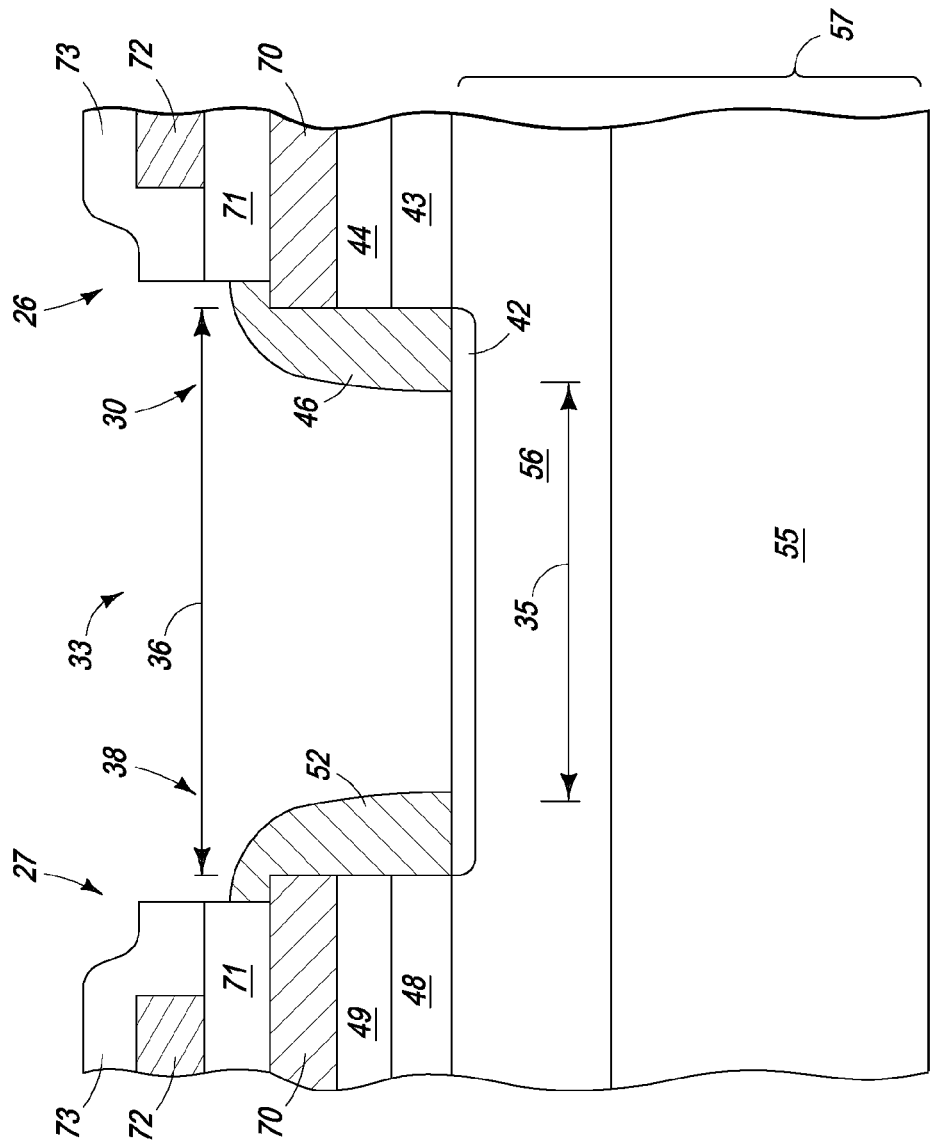
FIG. 7 illustrates an enlarged cross-sectional view of an embodiment of a portion of another plurality of semiconductor die that are an alternate embodiment of the plurality of semiconductor die of FIG. 1 in accordance with the present invention.

FIG. 7 illustrates an enlarged cross-sectional portion of an alternate embodiment of edge seals 30 and 38. For the embodiment illustrated in FIG. 7, dielectric layers 39 and 40 are formed as explained in the description of FIGS. 3-4. Thereafter, a metal layer 70 is formed on layer 40 to function as an electrical contact to metal layers 46 and 52. Subsequently another inter-layer dielectric 71 may be formed on metal layer 70. Other metalization layers may also be used to form a multi-layer metal system. For example, another metal layer 72 may be formed on dielectric 71 and a passivation layer 73 may be formed on layer 72 and exposed portions of dielectric 71. A mask (not shown) is applied and patterned to form an opening having a width 36 to expose where scribe grid 33 and metal layers 46 and 52 are to be formed. The exposed portions of layers 71-73 and 43-44 are removed to expose the surface of substrate 57. The mask is removed and layer 73 functions as a mask during the formation of doped region 42. Subsequently, a metal is blanket deposited and anisotropically etched to any depth to form metal layers 46 and 52 that not only electrically contact doped region 42 but also electrically contact metal layer 70. Thereafter, wafer 25 is sintered and dice 26 and 27 are singulated.

In view of all of the above, it is evident that a novel semiconductor device and method is disclosed. Included, among other features, is forming a plurality of dielectric layers extending from an edge seal region of a one die across a scribe grid to an edge seal region of an adjacent die. One etching operation is used to form an opening through the plurality of dielectric layers to expose a portion of the underlying substrate between the two die. Subsequently, a top dielectric layer of the plurality of dielectric layers is used as a mask to form a doped region in the substrate through the opening followed by forming metal layers on the doped region and abutting outside edges of the dielectric layers that are exposed within the opening. These process steps minimize the number of masking and processing operations required to form the device there by reducing the cost thereof.

While the subject matter of the invention is described with specific preferred embodiments, it is evident that many alternatives and variations will be apparent to those skilled in the semiconductor arts. More specifically the subject matter of the invention has been described for a particular P-channel vertical power MOS transistor structure, although the method is directly applicable to other vertical power MOS transistors, as well as to other types of semiconductor die including integrated circuits having a plurality of transistor types.

The invention claimed is:

1. A method of forming an edge seal region of a semiconductor die comprising:
   forming a first dielectric layer on a substrate adjacent to a scribe grid area of the substrate;
   forming a second dielectric layer overlying the first dielectric layer;
   forming a doped region on the substrate and self-aligned to an edge of the second dielectric layer; and
   forming a metal spacer on the doped region and self-aligned to an edge of the first dielectric layer.

2. The method of claim 1 wherein forming the doped region on the substrate includes forming a passivation layer overlying the second dielectric layer and using the passivation layer as a mask to form an opening through the second dielectric layer and the first dielectric layer and further including forming the doped region through the opening then forming the metal spacer through the opening.

3. The method of claim 1 wherein forming the metal spacer includes forming the metal spacer and leaving a surface of the substrate that is abutting the metal spacer and distal from the first dielectric layer exposed, and further including cutting through the substrate where the surface of the substrate is exposed.

4. The method of claim 1 further including forming active regions of the semiconductor die in an interior section of the semiconductor die before the step of forming the doped region on the substrate wherein forming the active regions include forming active doped regions and activating dopants within the active doped regions;
   wherein the step of forming the doped region includes not performing an activation step after forming the doped region on the substrate; and
   wherein the step of forming the metal spacer includes not exposing the semiconductor die to a temperature that is greater than a temperature required to sinter the metal spacer.

5. The method of claim 1 wherein forming the metal spacer includes forming a metal layer overlying the second dielectric layer and on the substrate overlying the doped region; and anisotropically etching the metal layer to remove first portions of the metal layer and leave second portions of the metal abutting the edge of the first dielectric layer as the spacers.

6. The method of claim 1 wherein forming the doped region on the substrate includes forming an opening through the first and second dielectric layers and exposing the substrate, and forming the doped region through the opening subsequent to the step of forming the second dielectric layer.

* * * * *